US009523722B2

(12) United States Patent
Tasher et al.

(10) Patent No.: US 9,523,722 B2
(45) Date of Patent: Dec. 20, 2016

(54) METHOD AND APPARATUS FOR SUPPLY VOLTAGE GLITCH DETECTION IN A MONOLITHIC INTEGRATED CIRCUIT DEVICE

(71) Applicant: Winbond Electronics Corporation, Taichung (TW)

(72) Inventors: Nir Tasher, Tel-Mond (IL); Valery Teper, Petah-Tikva (IL); Dennis Chin Cheng, Palo Alto, CA (US); Koying Huang, San Jose, CA (US)

(73) Assignee: WINBOND ELECTRONICS CORPORATION, Taichung (TW)

( * ) Notice: Subject to any disclaimer, the term of this patent is extended or adjusted under 35 U.S.C. 154(b) by 181 days.

(21) Appl. No.: 14/293,820

(22) Filed: Jun. 2, 2014

(65) Prior Publication Data

US 2015/0346246 A1    Dec. 3, 2015

(51) Int. Cl.
*G01R 19/165* (2006.01)
*G06F 1/28* (2006.01)
*G06F 1/30* (2006.01)

(52) U.S. Cl.
CPC ... *G01R 19/16552* (2013.01); *G01R 19/16576* (2013.01); *G06F 1/28* (2013.01); *G06F 1/30* (2013.01)

(58) Field of Classification Search
CPC .... G01R 31/2851; G01R 31/28; G01R 19/165
See application file for complete search history.

(56) References Cited

U.S. PATENT DOCUMENTS

| 3,679,917 A | * | 7/1972 | Bryant | H03K 19/086 327/513 |
| 5,117,201 A | * | 5/1992 | Luther | H03G 3/3026 330/279 |
| 5,369,310 A | * | 11/1994 | Badyal | H03K 17/223 327/143 |
| 5,602,500 A | | 2/1997 | Fournel | |
| 5,736,876 A | | 4/1998 | Fournel | |

(Continued)

FOREIGN PATENT DOCUMENTS

| DE | 10120147 A1 | 10/2002 |
| EP | 0568440 | 11/1993 |

(Continued)

OTHER PUBLICATIONS

Gruber, Dominik et al. A Voltage Reference with On-Chip Trimmable Temperature Coefficient and Offset Voltage, MIXDES 2011, 18th International Conference "Mixed Design of Integrated Circuits and Systems," Jun. 16-18, 2011. pp. 231-236.

(Continued)

*Primary Examiner* — Vinh Nguyen
*Assistant Examiner* — Alvaro Fortich
(74) *Attorney, Agent, or Firm* — D. Kligler IP Services Ltd.

(57) ABSTRACT

A monolithic integrated circuit device may include a supply voltage glitch detector for detecting improper supply voltage conditions. Advantageously, the detection threshold of the supply voltage glitch detector is adaptively set based on the mode of operation of the device or a particular part of the device, which is internally known to the device based on certain inputs received by the device, such as commands, interrupts, control signals, and so forth.

19 Claims, 7 Drawing Sheets

(56) References Cited

U.S. PATENT DOCUMENTS

| | | | |
|---|---|---|---|
| 6,085,342 A * | 7/2000 | Marholev | G06F 11/1441 327/143 |
| 6,204,706 B1 * | 3/2001 | Horvath | G06F 1/28 327/143 |
| 6,329,873 B2 * | 12/2001 | Morishita | 327/541 |
| 6,392,432 B1 | 5/2002 | Jaimsomporn et al. | |
| 6,570,934 B1 | 5/2003 | Harada | |
| 7,003,421 B1 | 2/2006 | Allen, III et al. | |
| 8,779,827 B2 | 7/2014 | Kung | |
| 2001/0015661 A1 * | 8/2001 | Fournel | G01R 19/16519 327/81 |
| 2002/0186038 A1 | 12/2002 | Bretschneider | |
| 2003/0226082 A1 | 12/2003 | Kim et al. | |
| 2005/0218939 A1 * | 10/2005 | Ma | G01R 19/16552 327/78 |
| 2006/0033486 A1 | 2/2006 | Chou | |
| 2006/0206843 A1 * | 9/2006 | Zarkesh-Ha | G06F 17/5036 716/115 |
| 2006/0214672 A1 | 9/2006 | Jenkins et al. | |
| 2007/0139988 A1 | 6/2007 | Malherbe et al. | |
| 2008/0061843 A1 * | 3/2008 | Yanci | G06K 19/07735 327/78 |
| 2009/0195301 A1 * | 8/2009 | Narayanan | G05F 3/30 327/539 |
| 2010/0045357 A1 | 2/2010 | Chen et al. | |
| 2011/0074398 A1 | 3/2011 | Barton et al. | |
| 2012/0176178 A1 | 7/2012 | Yang et al. | |
| 2012/0293017 A1 * | 11/2012 | Lidsky | H02H 3/087 307/126 |
| 2013/0027815 A1 * | 1/2013 | Gaknoki | H02M 1/32 361/18 |
| 2013/0117620 A1 * | 5/2013 | Joo | G11C 16/10 714/746 |
| 2015/0287478 A1 * | 10/2015 | Chen | G11C 29/26 714/719 |

FOREIGN PATENT DOCUMENTS

| | | |
|---|---|---|
| EP | 1804199 A1 | 7/2007 |
| JP | 2000-174826 | 6/2000 |
| JP | 2012-133222 | 7/2012 |
| KR | 10-2003-0092777 | 12/2003 |
| TW | I285375 | 8/2007 |
| WO | 9850859 A1 | 11/1998 |
| WO | 2006114727 A1 | 11/2006 |

OTHER PUBLICATIONS

Skorobogatov, Sergei. Fault Attacks on Secure Chips: from Glitch to Flash, Design and Security of Cryptographic Algorithms and Devices (Slides), Albena, Bulgaria, May 29-Jun. 3, 2011. 64 Pages.

Yang, Jung-Lin et al. Tunable Delay Element for Low Power VLSI Circuit Design, IEEE No. 1-4244-0549-1/06, 2006. 4 Pages.

European Patent Office. Extended European Search Report: European Patent Application No. 14179710.0, Jan. 28, 2015. 9 Pages.

Korean Intellectual Property Office. Office Action: Korean Patent Application No. 10-2014-0116321, Jun. 18, 2015. 8 Pages.

Rizk, Michael et al. Optimizing the Automatic Selection of Spike Detection Thresholds Using a Multiple of the Noise Level, Med Biol. Eng. Comput., vol. 47, No. 9, Sep. 2009. pp. 955-966.

Japanese Patent Office. Office Action: Japanese Patent Application No. 2015-009679, Feb. 2, 2016. 8 Pages.

TW Application # 103135783 Office Action dated Jun. 8, 2016.

* cited by examiner

| THRESHOLD PARAMETER | DEFAULT VALUE | ADAPTIVE VALUE |
|---|---|---|
| LV LEVEL | 1.4V | 1.3V |
| HV LEVEL | 2.05V | 2.15V |
| LV PULSE WIDTH | 10nS | 20nS |
| HV PULSE WIDTH | 10nS | 20nS |

METHOD AND APPARATUS FOR SUPPLY VOLTAGE GLITCH DETECTION IN A MONOLITHIC INTEGRATED CIRCUIT DEVICE

BACKGROUND OF THE INVENTION

Field of the Invention

The present invention relates to detection of out-of-spec operation of monolithic integrated circuit devices, and more particularly to supply voltage glitch detection in monolithic integrated circuit devices.

Description of Related Art

Some types of monolithic integrated circuit devices contain one or more analog detection circuits that monitor the operational conditions of the device such as, for example, supply or internal voltages, temperature, and clock rate, to detect when the device operates outside of specific margins. When such an out-of-spec condition is detected, the analog detection circuit causes the monolithic silicon device to be placed in a state such as power off or reset that prevents incorrect operation of the device or damage to the device or system in which the device is used.

Establishing the operating condition margins is challenging, since the detection circuit can false trigger if the margins are too narrow, and can become overly unresponsive if the margins are too broad.

Improvement in the monitoring of the operational conditions of the device detection circuits is desirable to reduce the risk of false triggers on the one hand and nonresponsiveness on the other.

BRIEF SUMMARY OF THE INVENTION

One embodiment of the present invention is a method for detecting a glitch in supply voltage provided to a monolithic integrate circuit device having various modes of operation, comprising: operating the device in a first mode of operation selected from the modes of operation; configuring, in response to the first mode operating step, a configurable detection threshold as one of a plurality of detection thresholds respectively associated with one or more of the modes of operation, in accordance with the first mode of operation; and monitoring the supply voltage for a glitch that violates the configurable detection threshold as configured in the configurable detection threshold configuring step.

Another embodiment of the present invention is a method for detecting a glitch in supply voltage provided to a monolithic integrate circuit device having various modes of operation, comprising: operating the device in one of a read, erase or program mode of operation; configuring, in response to the operating step, a configurable low detection threshold as either a first low detection threshold associated with the read mode of operation, or as a second low detection threshold associated with the erase and program modes of operation; configuring, in further response to the operating step, a configurable high detection threshold as either a first high detection threshold associated with the read mode of operation, or as a second high detection threshold associated with the erase and program modes of operation; and monitoring the supply voltage for a glitch that violates either the configurable low detection threshold as configured in the configurable low detection threshold configuring step, or the configurable high detection threshold as configured in the configurable high detection threshold configuring step.

Another embodiment of the present invention is a monolithic integrated circuit device having various modes of operation, comprising: a plurality of functional circuits configured to operate respectively at the various modes of operation; control logic configured to provide a control signal indicative of a currently active one of the various modes of operation; and a supply voltage threshold detection circuit configurable in any one or more of a plurality of detection thresholds respectively associated with one or more of the modes of operation, the supply voltage monitoring circuit being coupled to the control logic and configurable in response to the control signal to provide an alarm on an output thereof when the supply voltage violates one of the detection thresholds depending on the currently active mode of operation.

DETAILED DESCRIPTION OF THE INVENTION

A monolithic integrated circuit device may include one or more nonvolatile digital memory arrays of various types such as EEPROM, Flash and SRAM, and related circuits such as buffers, registers, control logic, addressing circuits, and voltage pumps. Depending on the functional requirements, the device may also include other circuits such as processors, input/output controllers, analog-to-digital and digital-to-analog converters, reset and interrupt circuits, field-programmable gate arrays ("FPGA"), and/or other circuits. The integrated circuit device may also include a supply voltage glitch detector for detecting improper transient supply voltage conditions. Advantageously, the detection threshold of the supply voltage glitch detector is adaptively configured based on the mode of operation of the device or a particular part of the device, which is internally known to the device based on certain inputs received by the device, such as commands, interrupts, control signals, and so forth. Consider, for example, a supply voltage glitch detector having an adaptive low voltage threshold that varies as a function of the mode of operation of a flash memory array in the integrated circuit device. The minimum supply voltage for such a device may be specified at 1.62 volts, and the supply voltage monitor may have a default low voltage threshold of 1.4 volts (a 0.22 volt margin) which is suitable for many common operations including memory read operations. However, the low voltage threshold may be temporarily reduced to 1.3 volts (a 0.32 volt margin) for such operations as memory program and erase operations, which are likely to cause voltage glitches of under 1.4 volts which would falsely trigger a protective state if the low threshold were not adaptively modified. The 1.3 volts and 1.4 volts threshold levels are illustrative, since in practice the various thresholds may be set based on a variety of factors such as process, voltage and temperature ("PVT") variation effects and internal current consumption effects.

Figures 1, 2:
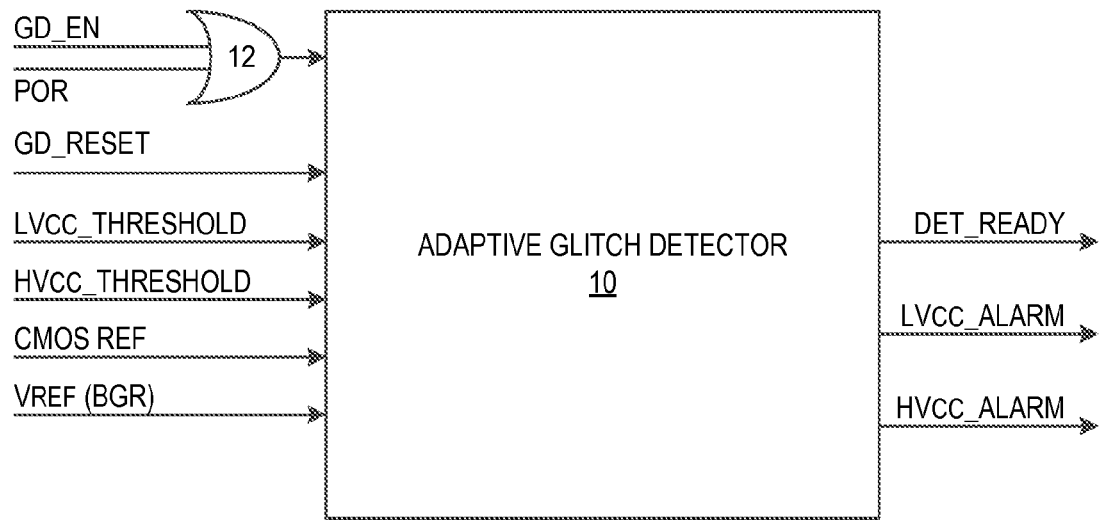
FIG. 1 is a schematic block diagram of various signals associated with an illustrative adaptive supply voltage glitch detector.
FIG. 2 is a table showing illustrative threshold voltage levels and pulse width settings for the glitch detector of FIG. 1.

FIG. 1 is a schematic block diagram of the various signals associated with an illustrative adaptive supply voltage glitch detector 10. Illustratively, the glitch detector 10 monitors for both low voltage and high voltage glitches, and provides output signals LVcc_ALARM and HVcc_ALARM to indicate a low threshold alarm condition and a high threshold alarm condition respectively. Illustratively, LVcc_ALARM and HVcc_ALARM are latched signals, which are set in a latched alarm state when the respective thresholds are violated; specifically when the supply voltage respectively drops below the low threshold or exceeds the high threshold. Signals LVcc_ THRESHOLD and HVcc_THRESHOLD may be used to adaptively set the detection threshold of the supply voltage glitch detector based on the mode of operation of the device or a particular part of the device. Additional input signals may include a reference voltage CMOS REF or $V_{REF}$ (BGR), a reset signal GD_RESET, a glitch detector enable signal GD_EN, and a power-on-reset signal POR. The enable signal GD_EN and the power-on-reset signal POR may be applied to an enable input EN through an OR gate 12 or equivalent. Additionally, a detector-ready output signal DET_READY may be provided. Certain default operating conditions such as the low threshold level and pulse width and the high threshold level and pulse width may be established during manufacture.

FIG. 2 is a table showing illustrative default and adaptive values for various illustrative low threshold and high threshold parameters, for the glitch detector 10 of FIG. 1. Illustratively, the low threshold voltage level may be set to 1.4 volts by default and to 1.3 volts adaptively, and the high threshold voltage level may be set to 2.05 volts by default, and to 2.15 volts adaptively. Illustratively, the low threshold minimum glitch duration may be set to 10 nanoseconds by default and to 20 nanoseconds adaptively, and the high threshold minimum glitch duration may be set to 10 nanoseconds by default and to 20 nanoseconds adaptively.

The low and high threshold voltage and pulse width settings for various modes of operations may be established by taking into account the reasonable worst cases for those operations, including, for example, worst case process, voltage and temperature ("PVT") variation effects and internal current consumption effects. The low threshold side of the operating window for a particular operation mode of the device, for example, may meet the following criteria: just above the power-on-reset ("POR") level, as well as just above the supply voltage level at which the logic functions properly. When the supply voltage is below this level, the normal behavior of the device likely is compromised and the device may behave randomly. The predetermined operating window of the supply voltage for glitch detection may be wider than the supply voltage range in the specification; for example, $V_{CC}$ in the specification may be listed as 1.62V to 1.98V (1.8 v+/−10%), whereas the operating window for glitch detection corresponding to a particular set of device modes of operation may be determined to be 1.4 volts to 2.05 volts, and corresponding to another particular set of device modes of operation may be determined to be 1.3 volts to 2.15 volts, to provide sufficient margins or a guard band to the $V_{CC}$ range of the device specification even while taking into account PVT variation effects and internal current consumption effects, including voltage variations due to impedance effects and current drops and surges due to device activity.

Having an adaptively set operating window for glitch detection is advantageous over a static operating window. Some worst case operation(s) such as, for example, program and erase operations in embedded flash memory, may create an amount of impedance-related voltage fluctuations and noise that is substantially greater that the voltage fluctuations and noise created by other operations. The flash cell program and erase operation, for example, may create a large current surge by enabling on-chip charge pump(s). Drain programming current, for example, may be about 100 uA per flash cell (at about 4 volts drain voltage) for channel hot electron injection, and therefore may be cumulatively about 800 uA in the case of programming eight cells (that is, one byte). The voltage supply current ($I_{CC}$) for charge pump(s) can easily reach many milli-amperes since voltage is pumped from the $V_{CC}$ level (typically 1.8V) to a higher pumped level of about 4 volts, for example. During erase operation (tunneling), although cell current is sub microampere, there may nonetheless be a few milli-amperes of current associated with enabling positive and negative charge pumps. Such current surges due to enabling charge pump(s) during program and erase operations may impose undershoot and overshoot effects on the supply voltage, which a glitch detector operating with a static operating window may misconstrued as an out-of-spec event, leading to an false alarm which in turn may trigger an unnecessary and disruptive protective action such as device shut-off or reset.

The adaptively set operating window for glitch detection may also take into account glitch duration. Establishing different minimum glitch duration settings for different device modes of operation allows for various problems afflicting some modes of operation to be avoided without sacrificing glitch detection accuracy for other modes of operation. Due to internal inherent on-chip impedances, there is a certain minimum glitch duration, typically a few nanoseconds, before a glitch can be successfully detected by on-chip glitch detection circuitry for a particular mode of operation. Moreover, it may be advantageous to design for a certain minimum glitch duration, for example 10 nS, since shorter glitches such as, for example, 3 nS to 4 nS, may not have a deleterious effect in a particular mode of operation.

Figure 3:
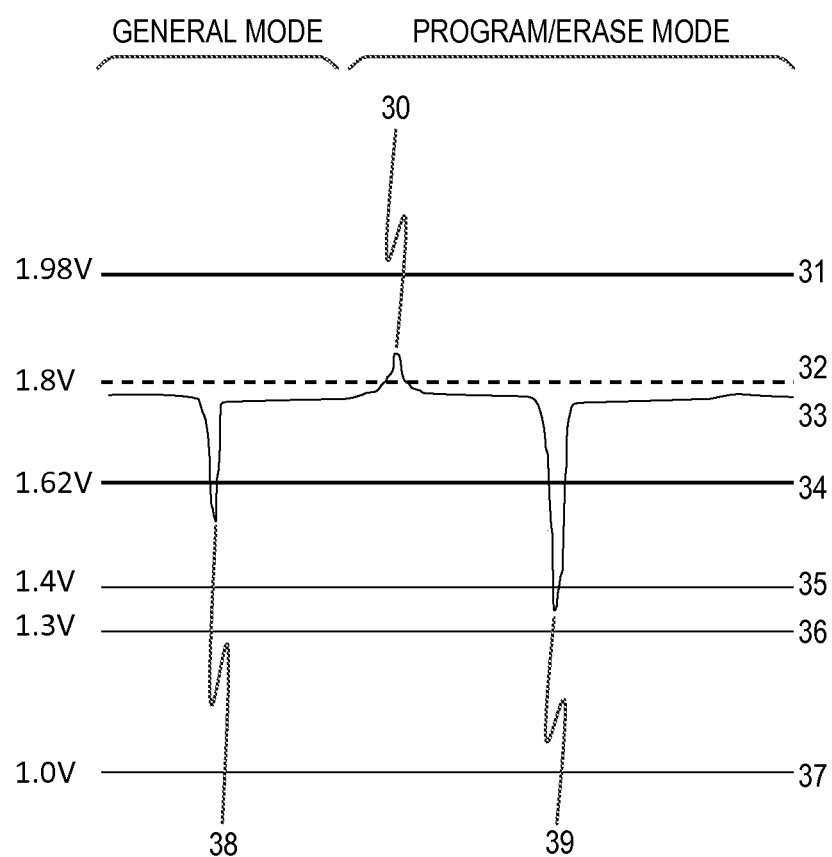
FIG. 3 is a set of waveforms showing various operations of the glitch detector of FIG. 1.

The foregoing behavior is illustrated in FIG. 3 for an exemplary monolithic integrated circuit device which includes a flash memory array and is specified for operation within an illustrative set of operating conditions. Illustratively, $V_{CC}$ is specified at 1.8V as shown by line 32, not to exceed a maximum $V_{CC}$ of 1.98V as indicated by line 31, and not to be less than a minimum $V_{CC}$ of 1.62V as indicated by line 34. Based on an analysis of PVT variation effects and internal current consumption effects, including voltage variations due to impedance effects and current drops and surges due to device activity, an adaptive low threshold may be established which has a value of 1.4 volts for general modes of operation as indicated by line 35, and a value of 1.3 volts for particularly disruptive modes of operation such as program and erase modes of operation of the flash memory as indicated by line 36. The adaptive low threshold voltages are above the power-on-reset voltage level of 1.0 volts indicated by line 37, and illustratively the monolithic integrated circuit device is able to operate normally and without alarms during general modes of operation with transients which are not lower than 1.4 volts, and during flash memory program and erase modes of operations with transients which are not lower than 1.3 volts.

Waveform 33 represents possible $V_{CC}$ behavior during actual normal device operation. A high voltage glitch 30 occurs within the specified $V_{CC}$ range and requires no special handling. Two low voltage glitches 38 and 39 are under the minimum specified $V_{CC}$ of 1.62 volts. The glitch 38 occurs during one of the general modes of operation and neither affects proper operation of the monolithic integrated circuit nor exceeds the low threshold adaptively set at 1.4 volts corresponding to general modes of operation so that no alarm is triggered. The glitch 39 occurs during one of the program or erase modes of operation, and neither affects proper operation of the monolithic integrated circuit nor exceeds the low threshold adaptively set at 1.3 volts corresponding to the program and erase modes of operation so that no alarm is triggered. Should the glitch 39 occur during one of the general modes of operation for which the low threshold is adaptively set at 1.4 volts, the glitch 39 is identified as abnormal and an alarm may be triggered.

Although FIG. 3 provides an example of an adaptive threshold for low voltage transients, an adaptive threshold for high voltage transients may be established in a similar manner. Moreover, although the thresholds are described as being adaptive to program and erase modes of operation on the one hand, and to general modes of operation (modes other than program and erase) on the other hand, the thresholds may be adaptive in various ways to other modes of operation and other combinations of modes of operation, including more than two modes of operation.

Figure 4:
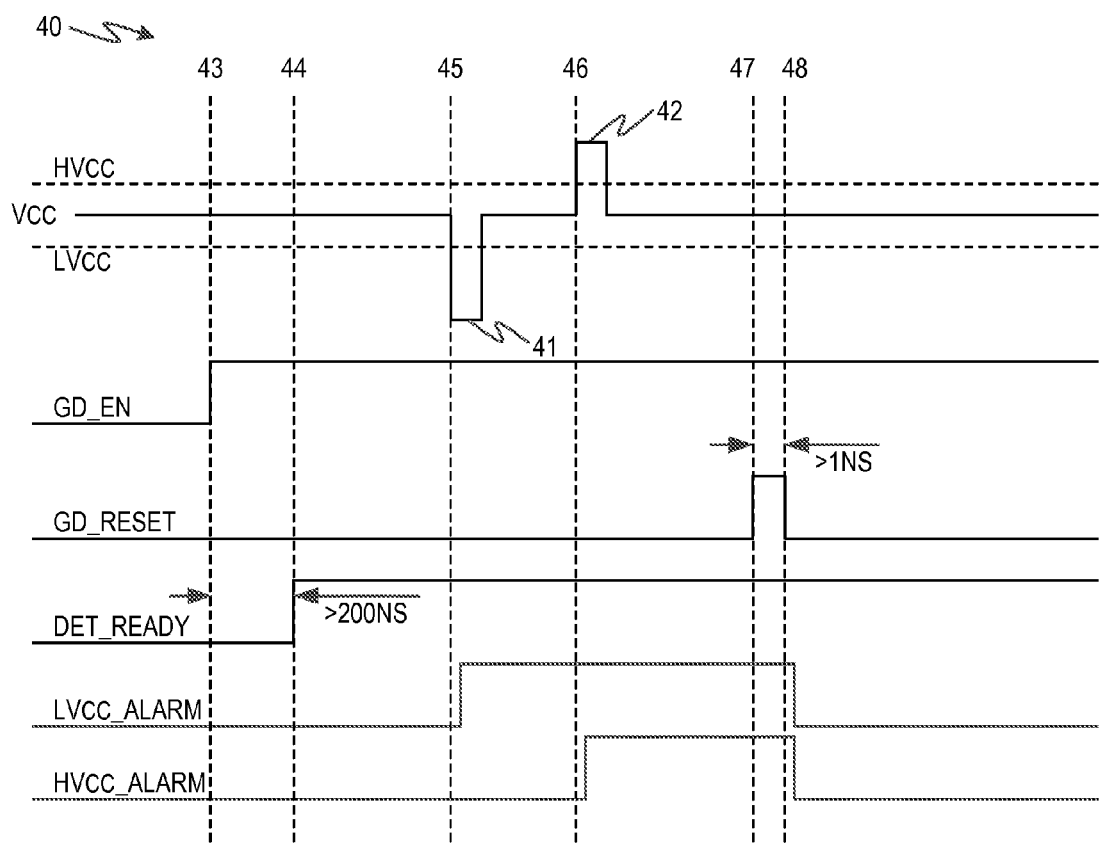
FIG. 4 is a set of idealized timing waveforms for the setting and resetting of the low and high supply voltage alarms of the adaptive glitch detector of FIG. 1, using adaptive supply voltage glitch detection.

FIG. 4 shows a set 40 of idealized timing waveforms for the setting and resetting of the low and high supply voltage alarms of the adaptive glitch detector 10 of FIG. 1, using adaptive supply voltage glitch detection. The supply voltage $V_{CC}$ generally is provided at a specified level but two illustrative glitch events are shown, a low voltage glitch 41 which starts at time 45 and dips below the adaptive low threshold $LV_{CC}$ (only a single voltage setting is shown for clarity), and a high voltage glitch 42 which starts at time 46 and exceeds the high threshold $HV_{CC}$ (only a single voltage setting is shown for clarity). The adaptive glitch detector 10 may be enabled at the leading edge of the enable signal GD_EN at time 43, after which the adaptive glitch detector 10 signals ready by the positive transition of detector ready output signal DET_READY at time 44, illustratively greater than about 200 nS after the enable signal GD_EN. When the low voltage glitch 41, which occurs at time 45, has a duration in excess of the minimum pulse width corresponding to $LV_{CC}$, it is detected by the glitch detector 10 which signals the low voltage alarm $LV_{CC}$_ALARM. In a similar manner, when the high voltage glitch 42, which occurs at time 46, has a duration in excess of the minimum pulse width corresponding to $HV_{CC}$, it is detected by the glitch detector 10 which signals the high voltage alarm $HV_{CC}$_ALARM. The alarms may be reset by the signal GD_RESET, which illustratively is asserted as a reset pulse of a width greater than about 1 nS over a period from time 47 to time 48. As shown by the waveforms $LV_{CC}$_ALARM and $HV_{CC}$_ALARM, both alarms reset a short time after the falling edge of the reset pulse.

Figure 5:
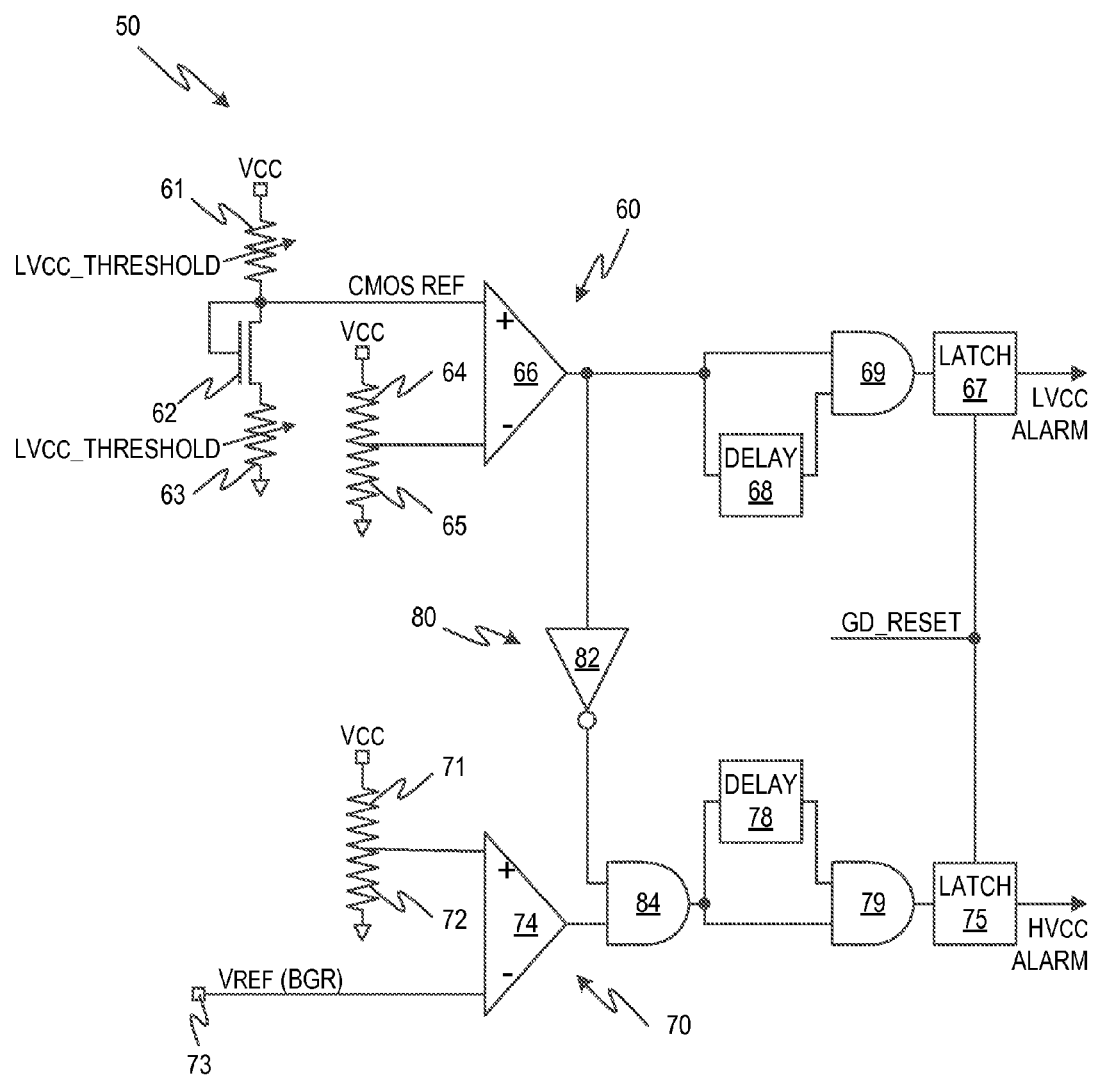
FIG. 5 is a schematic circuit diagram of an illustrative implementation of the adaptive glitch detector 10 of FIG. 1.

FIG. 5 is a schematic circuit diagram of an illustrative implementation 50 of the adaptive glitch detector 10 of FIG. 1. The adaptive glitch detector 10 includes a low threshold detector 60, a high threshold detector 70, and a power-on instability corrective circuit 80.

The low threshold detector 60 includes a differential amplifier 66 which is connected at its inverting input to a series resistance 64 and 65 connected between $V_{CC}$ and ground to provide a suitable bias to the differential amplifier 66. The resistors 64 and 65 may be suitably trimmed during manufacturing to establish the desired bias. The non-inverting input is connected to a reference voltage for establishing the selected low threshold. Illustratively, the reference voltage may be a CMOS reference voltage provided by a circuit in which resistor 61, MOSFET 62, and resistor 63 are connected in series between $V_{CC}$ and ground. Either one or both of the resistances 61 and 63 may be made variable using any desired technique. One suitable technique well known in the art is to various MOSFET transistors (not shown) to switch various resistances in or out for establishing two or more different CMOS reference levels. The low threshold signal $LV_{CC}$_THRESHOLD may be a variable voltage signal applied to the gates of such MOSFET transistors to control their on/off states. During default operation of the low threshold detector 60, the voltage on the inverting input of the differential amplifier 66 is greater than the voltage on the non-inverting input, so that a low voltage appears on the output of the differential amplifier 66 which is latched by latch 67. However, when a glitch causes $V_{CC}$ to fall below the selected low threshold, the voltage on the inverting input of the differential amplifier 66 becomes less than the voltage on the non-inverting input, causing a positive transition at the output of the differential amplifier 66 which is latched by the latch 67 to generate the low threshold alarm $LV_{CC}$_ALARM.

The high threshold detector 70 includes a differential amplifier 74 which is connected at its non-inverting input to a series resistance 71 and 72, which is connected between $V_{CC}$ and ground to provide a suitable bias to the differential amplifier 74. The resistors 71 and 72 may be suitably trimmed during manufacturing to establish the desired bias. The inverting input of the differential amplifier 74 is connected to a reference voltage for establishing the selected high threshold. Illustratively, the reference voltage 73 may be a variable band gap reference ("BGR") circuit, which varies a reference voltage $V_{REF}$ depending on the desired high threshold. During default operation of the high threshold detector 70, the voltage on the non-inverting input of the differential amplifier 74 is less than the voltage on the inverting input, so that a low signal appears on the output of the differential amplifier 74, which keeps the output of the AND gate 84 low, which in turn is latched by latch 75. However, when a glitch causes $V_{CC}$ to rise above the selected high threshold, the voltage on the non-inverting input of the differential amplifier 74 becomes greater than the voltage on the inverting input, causing a positive transition at the output of the differential amplifier 74 which raises the output of the AND gate 84 high (assuming a high level from the power-on instability corrective circuit 80), which in turn is latched by latch 75 to generate the high threshold alarm $HV_{CC}$_ALARM.

Note that the low threshold detector 60 is not normally responsive to high glitches, while the high threshold detector 70 is not normally responsive to low glitches. Should a high glitch occur, the voltage on the inverting input of the differential amplifier 66 merely rises higher, thereby maintaining the output of the differential amplifier 66 low. Should a low glitch occur, the voltage on the non-inverting input of the differential amplifier 74 merely falls lower, thereby maintaining the output of the differential amplifier 74 low.

The power-on instability corrective circuit 80 corrects a problem which occurs in many types of band gap reference circuits, namely that such circuits are unstable until $V_{CC}$ reaches a certain minimum level. In particular, such band gap reference circuits are unstable during power-up when $V_{CC}$ tends to be very low; for example, when $V_{CC}$ tends to be in the range of 0.8 volts to 1.3 volts. Since $V_{CC}$ is lower than the low threshold during this period, the low threshold detector 60 applies a high signal to inverter 82, which in turn applies a low signal to the AND gate 84, thereby blocking any signals generated by the differential amplifier 74 in the high threshold circuit 70, which may be false, from reaching the latch 75.

Suitable variable band gap circuits are well known in the art. In one suitable type of band gap circuit, MOSFET transistors (not shown) may be used to switch various resistances in or out for establishing two or more different band gap reference $V_{REF}$ levels. The high threshold signal $HV_{CC\_}THRESHOLD$ may be a variable voltage signal applied to the gates of such MOSFET transistors to control their on/off states. An example of a suitable band gap reference circuit is described in Dominik Gruber et al., A Voltage Reference with On-Chip Trimmable Temperature Coefficient and Offset Voltage, MIXDES 2011, 18$^{th}$ International Conference "Mixed Design of Integrated Circuits and Systems," Jun. 16-18, 2011, PP. 231-236, which hereby is incorporated herein in its entirety by reference thereto.

The low threshold minimum glitch duration and the high threshold minimum glitch duration may be fixed or variable, or one may be fixed and the other variable. If variable, the low (or high) glitch detection duration may be coordinated with or independent of the low (or high) threshold voltage level. An illustrative technique for implementing a variable glitch detection duration sub-circuit is shown in FIG. 5, where the output of the differential amplifier 66 in the low threshold detector 60 is applied to an AND gate 69 as well as to a delay circuit 68, so that a trigger signal passes through the AND gate 69 only if it is of sufficient duration to remain asserted while the same trigger signal is delayed through the delay 68. If it is desired to coordinate the low glitch detection duration with the low threshold voltage level, the signal $LV_{CC\_}THRESHOLD$ may be used as the control signal for the delay 68. Otherwise, a different signal may be used. In a similar manner, the output of the differential amplifier 74 in the high threshold detector 70 is applied to an AND gate 79 as well as to a delay circuit 78, so that a trigger signal passes through the AND gate 79 only if it is of sufficient duration to remain asserted while the same trigger signal is delayed through the delay 78. If it is desired to coordinate the high glitch detection duration with the high threshold voltage level, the signal $HV_{CC\_}THRESHOLD$ may be used as the control signal for the delay 78. Otherwise, a different signal may be used. Suitable variable delay circuits are well known in the art; see, e.g., Jung-Lin Yang et al., Tunable Delay Element for Low Power VLSI Circuit Design, IEEE No. 1-4244-0549-1/06, 2006, PP. 1-4, which hereby is incorporated herein in its entirety by reference thereto.

The implementation of FIG. 5 is a example of one suitable adaptive glitch detector. Other voltage comparator circuits may be suitably modified to provide adaptive glitch detection in accordance with the description set forth in this patent document.

Figure 6:
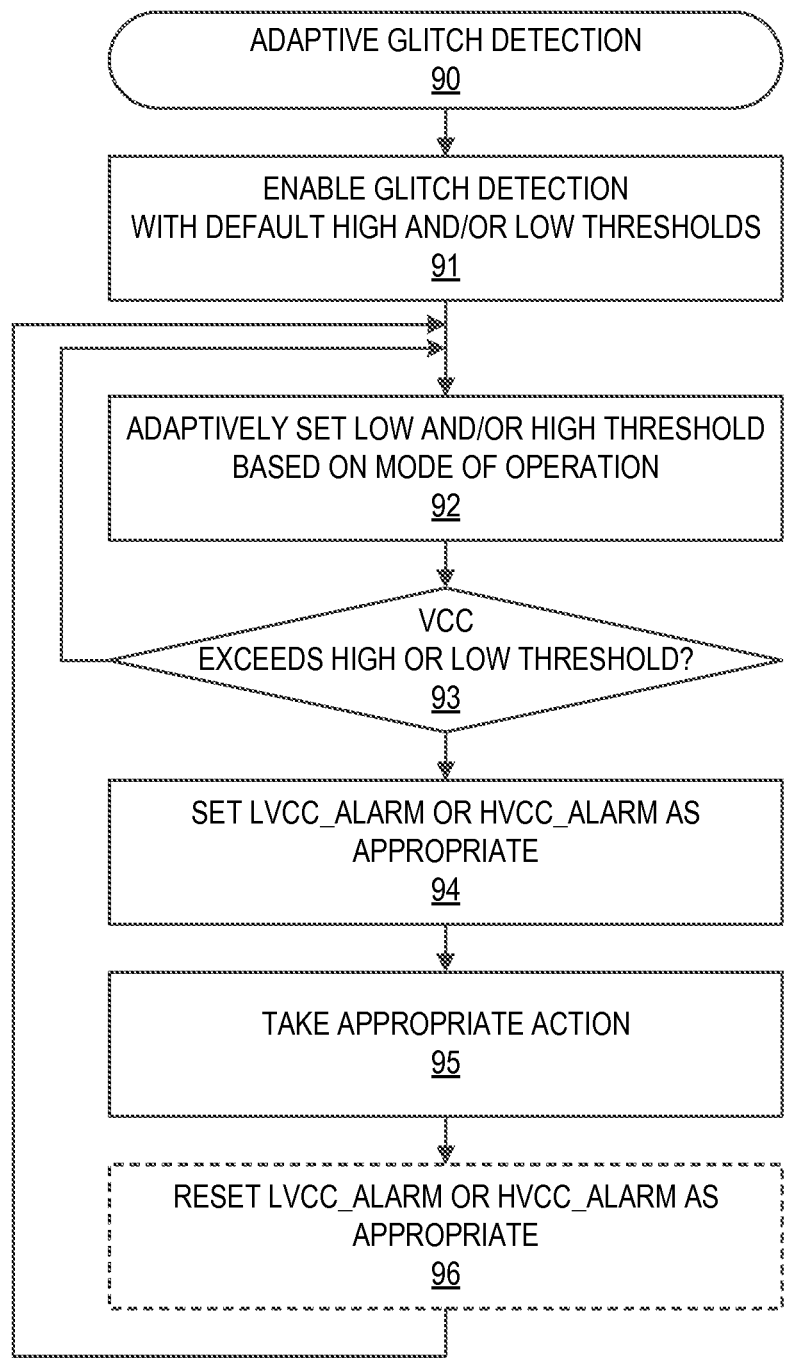
FIG. 6 is a flow chart showing an illustrative operating sequence for the adaptive glitch detector of FIG. 1.

FIG. 6 is a flow chart showing an illustrative operating sequence 90 for the adaptive glitch detector 10 of FIG. 1. Glitch detection may be enabled (block 91) in any desired manner, either as part of the power-on or power-on-reset procedure or by command. Default low and/or high thresholds may be established upon enablement, if desired. While the monolithic integrated circuit device is in operation, the glitch detector may be adaptively configured to a low threshold, a high threshold, or both a low and high threshold as desired based on the mode of operation (block 92). If neither the low threshold nor high threshold is exceeded while the mode of operation is in effect (block 93—NO), the sequence 90 returns to adaptively setting a low threshold, a high threshold, or both a low and high threshold as desired based on the mode of operation (block 92). However, if the low threshold or the high threshold is exceeded while the mode of operation is in effect (block 93—YES), either the low threshold alarm $LV_{CC\_}ALARM$ or the high threshold alarm $HV_{CC\_}ALARM$ is set as appropriate (block 94) so that the monolithic integrated circuit device may take appropriate action (block 95), such as shutting down the device, resetting the device, setting a register bit to indicate a possible fault, or other desired action. For devices which continue operation after glitch detection, the low threshold alarm $LV_{CC\_}ALARM$ or the high threshold alarm $HV_{CC\_}ALARM$ is reset as appropriate (block 96) and the sequence 90 returns to adaptively setting a low threshold, a high threshold, or both a low and high threshold as desired based on the mode of operation (block 92).

Exemplary Implementation: Glitch Detection for Secure Device

Nonvolatile digital memory may be used in monolithic integrated circuit devices to store sensitive information. Flash memory, for example, which is widely used in secure memory devices, systems-on-a-chip ("SOC"), and field-programmable gate arrays ("FPGA"), may be used to store instruction pointers, sensitive data, passwords, encryption keys, and the like, in any combination. Advantageously for these applications, flash memory is non-volatile, reprogrammable, one-time programmable, and low-power.

Unfortunately, many various types of secure integrated circuit devices are vulnerable to $V_{CC}$ glitch attacks in which an attacker varies $V_{CC}$ in an attempt to exploit possible weaknesses in the device design. In a Vcc undershoot glitch attack, for example, a flip-flop within the device logic may change state. Furthermore in this exemplary illustration, this may cause encryption logic, which checks whether commands are legal, to malfunction and allow illegal command to be executed. This is undesirable since security may be compromised. Detecting Vcc outside of the normal operating window and setting an alarm or taking other appropriate action is therefore useful for security of the secured chip.

To counter the threat of a Vcc glitch attack, an integrated circuit device may be provided with an adaptive glitch detector such as the adaptive glitch detector 10 (FIG. 1). The adaptive Vcc glitch detector may monitor Vcc at any desired location within the integrated circuit device, although monitoring as near to the external Vcc pin of the integrated circuit device as is practical may be advantageous in some integrated circuit devices to avoid the effects of internal circuit impedances on internal Vcc waveforms. Alternatively, monitoring $V_{CC}$ near sensitive circuits may be advantageous in some integrated circuit devices.

Figure 7:
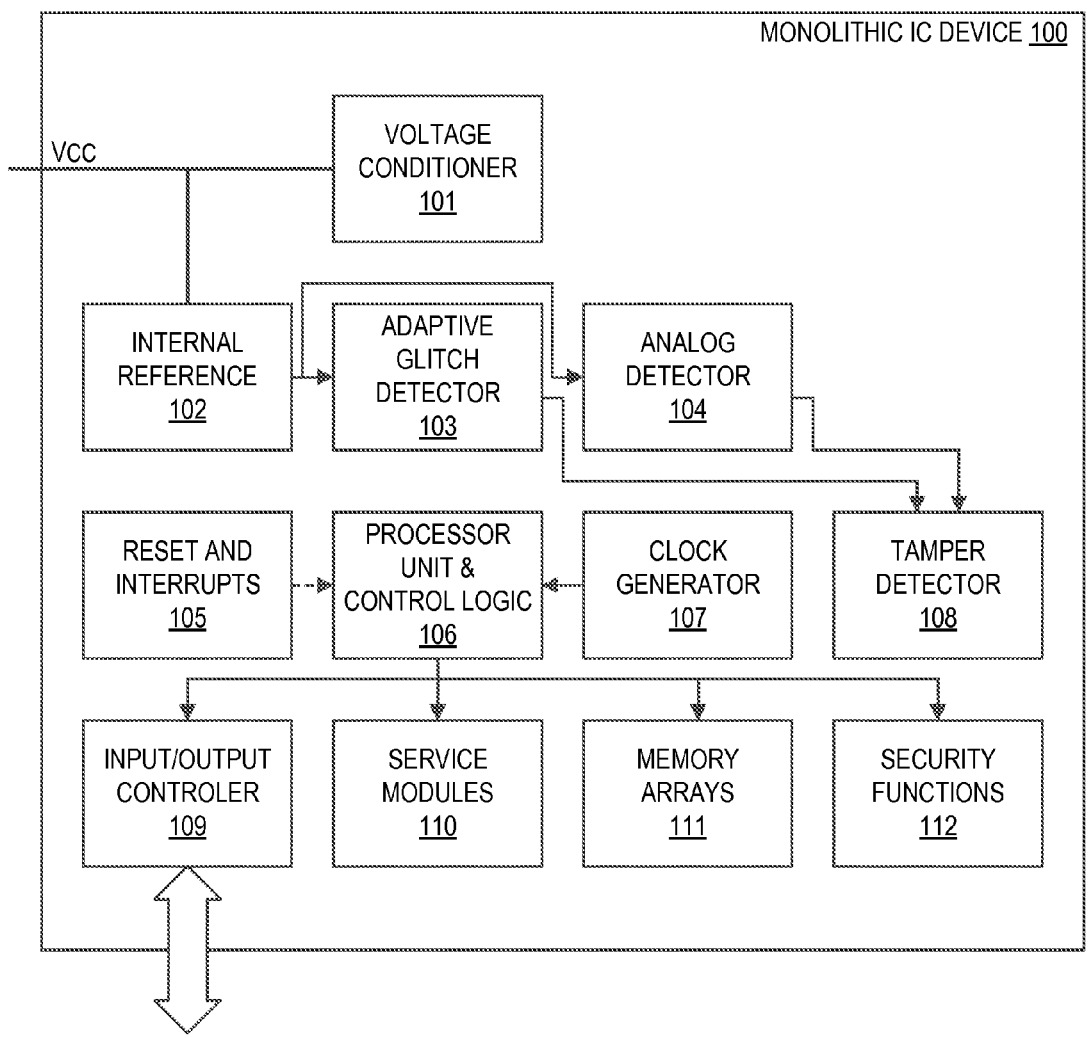
FIG. 7 is a schematic block diagram of an illustrative secure monolithic integrated device.

FIG. 7 is a schematic block diagram of an illustrative secure monolithic integrated device 100 which includes such circuits as voltage conditioner 101, internal reference 102, adaptive glitch detector 103, analog detector 104, reset and interrupts 105, processor unit and/or control logic 106, clock generator 107, tamper detector 108, input/output controller 109, service modules 110, memory arrays 111, and security functions (e.g. cryptography) 112. The adaptive glitch detector 103 provides the low threshold alarm signal $LV_{CC}$_ALARM and/or the high threshold alarm signal $HV_{CC}$_ALARM to the tamper detector 108, which determines an appropriate course of action in accordance with the threshold violated and the mode of operation in effect.

Exemplary Implementation: Glitch Detection for Non-Secure Device

Figure 8:
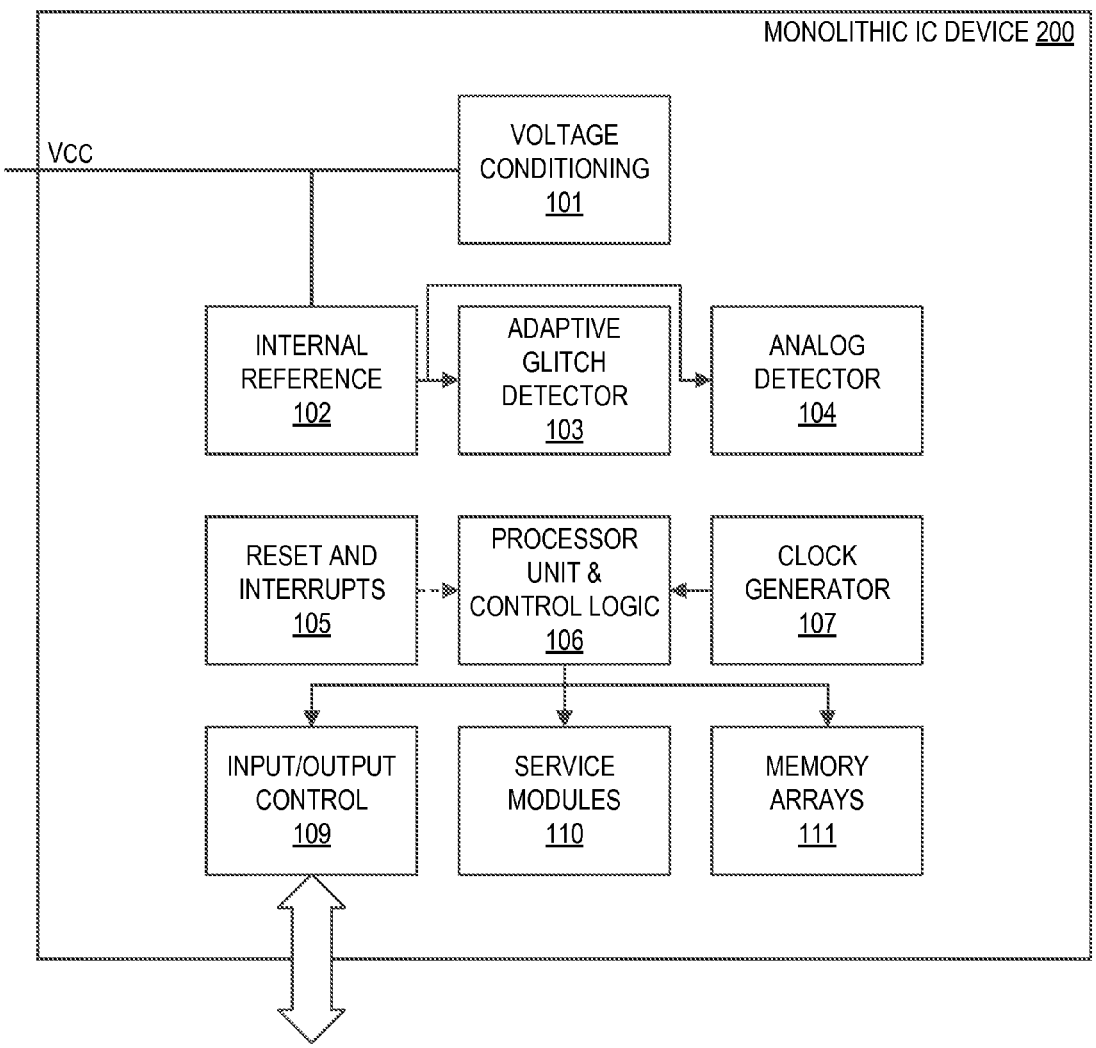
FIG. 8 is a schematic block diagram of an illustrative non-secure monolithic integrated device.

FIG. 8 is a schematic block diagram of an illustrative monolithic integrated device 200 which is similar to the secure monolithic integrated circuit device 100 (FIG. 7) but lacks the tamper detector 108 and security functions 112. The adaptive glitch detector 103 provides the low threshold alarm signal $LV_{CC}$_ALARM and/or the high threshold alarm signal $HV_{CC}$_ALARM to any desired functional element. The threshold alarm signals $LV_{CC}$_ALARM and/or $HV_{CC}$_ALARM may be provided, for example, to the reset and interrupts element 105 which may be configured to reset the device or certain functional elements of the device, or to processor unit and/or control logic 106 which may be configured to report the incident to an external device or circuit via input/output control 109.

The various embodiments of the invention described herein are illustrative of our invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention, as set forth in the following claims.

The invention claimed is:

1. A method for detecting a glitch in supply voltage provided to a monolithic integrated circuit device having various modes of operation, comprising:
   operating the device in one of a read, erase or program mode of operation;
   monitoring a mode of operation of the integrated circuit, to determine whether the integrated circuit is currently active in the read, erase or program mode of operation;
   selecting a configurable glitch detection parameter responsively to the currently active mode of operation;
   monitoring a supply voltage of the integrated circuit by a glitch detector of the integrated circuit; and
   providing by the glitch detector an alarm signal when the monitored supply voltage violates a glitch detection threshold in accordance with the selected glitch detection parameter.

2. The method of claim 1 wherein
providing an alarm signal when the monitored supply voltage violates a glitch detection threshold comprises providing an alarm when the monitored supply voltage has a minimum voltage amplitude less than the glitch detection threshold.

3. The method of claim 1 wherein
selecting a configurable glitch detection parameter comprises selecting a minimum duration of a glitch for which an alarm is provided and wherein providing the alarm signal comprises providing the alarm signal when the monitored supply voltage violates the glitch detection threshold for at least the minimum duration.

4. The method of claim 1 wherein
providing an alarm signal when the monitored supply voltage violates a glitch detection threshold comprises providing an alarm when the monitored supply voltage has a maximum voltage amplitude greater than the glitch detection threshold.

5. A method for detecting a glitch in supply voltage provided to a monolithic integrated circuit device having various modes of operation, comprising:
   operating the device in one of a read, erase or program mode of operation;
   monitoring a mode of operation of the integrated circuit, to determine whether the integrated circuit is currently active in the read, erase or program mode of operation;
   selecting a configurable low detection threshold as either a first low detection threshold associated with the read mode of operation, or as a second low detection threshold associated with the erase and program modes of operation, responsively to the currently active mode of operation;
   selecting a configurable high detection threshold as either a first high detection threshold associated with the read mode of operation, or as a second high detection threshold associated with the erase and program modes of operation, responsively to the currently active mode of operation; and
   monitoring the supply voltage of the integrated circuit by a glitch detector of the integrated circuit and providing by the glitch detector an alarm signal when the monitored supply voltage violates either the selected configurable low detection threshold, or the selected configurable high detection threshold.

6. The method of claim 5 wherein:
the first low detection threshold is approximately 1.4V;
the second low detection threshold is approximately 1.3V;
the first high detection threshold is approximately 2.05V; and
the second high detection threshold is approximately 2.15V.

7. A monolithic integrated circuit device having various modes of operation, comprising:
   a plurality of functional circuits configured to operate respectively at the various modes of operation that include read mode, erase mode, and program mode;
   control logic configured to provide a control signal indicative of whether the integrated circuit is currently active in anyone of the read, erase or program mode of operation; and
   a supply voltage threshold detection circuit coupled to the control logic and configurable in response to the control signal to select a configurable glitch detection parameter, to monitor a supply voltage of the integrated circuit and to provide an alarm on an output thereof when the supply voltage violates a glitch detection threshold in accordance with the selected glitch detection parameter.

8. The monolithic integrated circuit device of claim 7, wherein the detection circuit is configured monitor the supply voltage and provide an alarm signal if the supply voltage goes below a
low detection threshold or goes above a high detection threshold.

9. The monolithic integrated circuit device of claim 8, wherein the supply voltage threshold detection circuit comprises:
   a low threshold detector having a CMOS reference circuit controlled by the control signal; and
   a high threshold detector having a band gap reference circuit controlled by the control signal.

10. The monolithic integrated circuit device of claim 9, wherein the supply voltage threshold detection circuit further comprises a power-on instability corrective circuit having an input coupled to an output of the low threshold detector, and an output coupled to the high threshold detector, and configured to block an alarm signal from the high threshold detector during power-up of the monolithic integrated circuit.

11. The monolithic integrated circuit device of claim 7, wherein the supply voltage threshold detection circuit comprises:
a differential amplifier having an output, a bias input, and a variable reference voltage input responsive to the control signal; and
a latch coupled to the output of the differential amplifier.

12. The monolithic integrated circuit device of claim 11, further comprising a CMOS reference circuit responsive to the control signal and having an output coupled to the variable reference voltage input of the differential amplifier.

13. The monolithic integrated circuit device of claim 11, further comprising a band gap reference circuit responsive to the control signal and having an output coupled to the variable reference voltage input of the differential amplifier.

14. The monolithic integrated circuit device of claim 7, wherein the glitch detection parameter comprises an upper glitch detection threshold selected in response to the control signal and wherein the integrated circuit is configured to provide an alarm when the supply voltage is above the selected glitch detection parameter.

15. The monolithic integrated circuit device of claim 7, wherein the glitch detection parameter comprises a glitch detection duration selected in response to the control signal and wherein the integrated circuit is configured to provide an alarm when the supply voltage violates the glitch detection threshold for longer than the glitch detection parameter.

16. The monolithic integrated circuit device of claim 7, wherein the control logic is configured to provide a control signal indicative of whether the integrated circuit is in a read mode, a program mode or an erase mode and wherein the glitch detection parameter is selected by the supply voltage threshold detection circuit responsively to the mode indicated by the control signal provided by the control logic.

17. The method of claim 1, wherein selecting the glitch detection parameter comprises selecting a first glitch detection parameter when the integrated circuit is in the read mode and selecting a second, different, glitch detection parameter, when the integrated circuit is in an erase mode.

18. The method of claim 5, further comprising selecting a detection duration threshold, responsively to the currently active mode of operation, and wherein providing the alarm signal comprises providing the alarm signal when either the selected configurable low detection threshold or the selected configurable high detection threshold is violated for at least the duration of the selected detection duration threshold.

19. The method of claim 18, wherein selecting the detection duration threshold comprises selecting from a first duration of about 10 nS and a second duration of about 20 nS.

* * * * *